(12) United States Patent
Boemler

(10) Patent No.: US 10,425,604 B2
(45) Date of Patent: Sep. 24, 2019

(54) SELF-RECOVERING DIGITAL LATCH

(71) Applicant: Raytheon Company, Waltham, MA (US)

(72) Inventor: Christian M. Boemler, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 35 days.

(21) Appl. No.: 15/297,225

(22) Filed: Oct. 19, 2016

(65) Prior Publication Data

US 2018/0109749 A1    Apr. 19, 2018

(51) Int. Cl.
*H04N 5/374* (2011.01)
*H03K 3/037* (2006.01)
*H04N 5/378* (2011.01)
*H04N 5/33* (2006.01)

(52) U.S. Cl.
CPC ......... *H04N 5/3742* (2013.01); *H03K 3/0375* (2013.01); *H04N 5/378* (2013.01); *H04N 5/33* (2013.01)

(58) Field of Classification Search
CPC ........ H04N 5/3742; H04N 5/378; H04N 5/33; H03K 3/0375; G06F 11/1064
See application file for complete search history.

(56) References Cited

U.S. PATENT DOCUMENTS

| 6,937,527 | B1 | 8/2005 | Lotz | |
| 7,711,938 | B2* | 5/2010 | Wise | G06F 9/3867 345/506 |
| 8,081,010 | B1* | 12/2011 | Whitaker | H03K 19/0075 326/11 |
| 9,871,520 | B1* | 1/2018 | Nguyen | H03K 19/00392 |
| 2005/0242828 | A1* | 11/2005 | Lotz | H03K 3/0375 326/11 |
| 2007/0229132 | A1* | 10/2007 | Chu | G01R 31/318533 327/218 |
| 2013/0322145 | A1* | 12/2013 | Shin | H04N 5/378 365/49.11 |

OTHER PUBLICATIONS

PCT International Search Report and Written Opinion for International Application No. PCT/US2017/056876 dated Feb. 8, 2018, 11 pages.

* cited by examiner

*Primary Examiner* — Jason A Flohre
(74) *Attorney, Agent, or Firm* — Cantor Colburn LLP

(57) ABSTRACT

An electro-optical sensor chip assembly (SCA) that includes a detection device that includes an array of detector unit cells arranged in a matrix and that produce an electrical output in response to light. The SCA also includes an integrated control circuit in electrical communication with the detection device that includes a control word store to store a dataword. The control word store includes at least three sub-latches to redundantly store at least one bit of the dataword. The at least three sub-latches include a first sub-latch, a second sub-latch and a third sub-latch, each of the first sub-latch, the second sub-latch and the third sub-latch including an output and two recovery inputs, and the output of the first and third sub-latches are connected to the recovery inputs of the second sub-latch.

15 Claims, 3 Drawing Sheets

SELF-RECOVERING DIGITAL LATCH

BACKGROUND

The present disclosure relates to an electro-optical detectors and, more particularly, for a latch to hold command words for such electro-optical detectors.

Over the last few years, electro-optical sensors have been developed that incorporate increasingly higher resolution. Such detectors may have different operations modes or settings that need to be stored or altered.

In particular, such sensors may include a read-out integrated circuit (ROIC) that reads out the information received by an array of pixels. In certain cases, the ROIC may have different operations settings that need to be maintained.

Many ROIC's may be used for infrared imaging and require cooling to cryogenic temperatures to improve image quality. Power dissipation on ROIC is extremely critical for these applications since current coolers have low efficiency and the entire assembly may be mobile (e.g. vehicle, airborne or space craft) where system power is limited.

Traditionally, the ROIC's has been designed to receive the entire external commanding dataword (e.g., setting) periodically to refresh all dataword control bits on-chip. As ROIC's become more and more complex, this commanding dataword keeps increasing in size an can lead to increased excessive power dissipation from internal dataword management and distribution as well as increased complexity in the controlling system, having to store and transmit the dataword continuously. From time to time herein, the commanding dataword may be referred to as a command or control word.

In some cases, external events (such as a single event upset (SEU)) can cause the one or more bits of the dataword to be altered. An example of such an SEU is the effect of a lower power radiation event being experience by a satellite. If the SEU causes one of the bits of the control dataword to change, the operational mode of the ROIC may change in a manner that is not desired by the operator.

One approach to protect the datawords is to continuously refresh the dataword storage in the ROIC from an external controller. As the ROIC complexity increases and the number of control bits increases, the additional power and system complexity in having to re-transmit all datawords periodically becomes critical. Another approach to protect the datawords is to provide redundancy of each the dataword. Prior attempts at TMR (Triple Modular Redundancy) involved a "scrubbing" circuit that would periodically (e.g. every 30 ms) check the status of the three storage sites, vote amongst the three sites and write back the voted result to all three sites. This approach, while effective, may draw more power than is desired as all register bits have to be read, voted and written back at a high repetition rate. Further, such a solution may require additional complexity and power dissipation in on-chip timing controllers that have to cycle/ vote each bit. Another concern is that if two SEU events toggles two of the three sites at different times, but before the scrubbing circuit had a chance to visit the cell for correction of the first SEU event, the digital bit would be permanently flipped.

SUMMARY

According to one embodiment, an electro-optical sensor chip assembly (SCA) that includes a detection device that includes an array of detector unit cells arranged in a matrix and that produce an electrical output in response to light is disclosed. The SCA also includes an integrated control circuit in electrical communication with the detection device that includes a control word store to store a dataword. The control word store includes at least three sub-latches to redundantly store at least one bit of the dataword. The at least three sub-latches include a first sub-latch, a second sub-latch and a third sub-latch, each of the first sub-latch, the second sub-latch and the third sub-latch including an output and two recovery inputs, and the output of the first and third sub-latches are connected to the recovery inputs of the second sub-latch.

According to another embodiment, an integrated control circuit for controlling operation of a device is disclosed. The circuit includes a supply voltage input, a ground connection, and at least three sub-latches to redundantly store at least one bit of the dataword. The at least three sub-latches include a first sub-latch, a second sub-latch and a third sub-latch, each of the first sub-latch, the second sub-latch and the third sub-latch including an output and two recovery inputs, and wherein the output of the first and third sub-latches are connected to the recovery inputs of the second sub-latch.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be discussed below, errors associated with any type of circuit may be countered by providing an asynchronous correction of synchronous storage devices in real time. Such correction includes providing latches that include connections from redundant cells that automatically correct a faulty bit. While the following discussion is provided in the context of an ROIC, it shall be understood the teachings are not so limited any may be applied to any redundant circuit.

Figure 1:
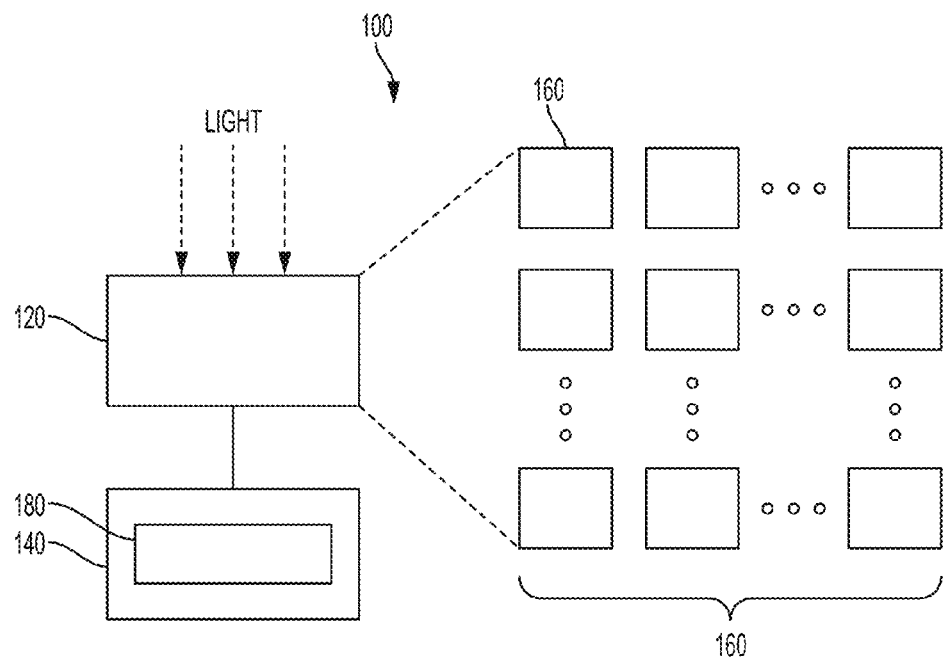
FIG. 1 is a schematic diagram illustrating an image detector in accordance with embodiments.

FIG. 1 is a schematic diagram illustrating an image detector 100 in accordance with embodiments. Such a detector 100 may be deployed, for example, on a satellite or other airborne apparatus such as an aircraft. Image detector 100 may be a focal plane array (FPA), active pixel sensor (APS) or any other suitable energy wavelength sensing device. The image detector 100 may be used as a component of a photographic and/or image capturing device, such as a digital camera, video camera or other similar device. The image detector 100 may include detection device 120 and ROIC 140.

The detection device 120 includes an array of photosensitive/energy wavelength sensitive detector unit cells 160 arranged in an X×Y matrix. Each of the detector unit cells 160 may accumulate charge or produce a current and/or voltage in response to light incident upon the detector unit cell 160 and may correspond to a pixel in a captured electronic image. One or more of the detector unit cells 160 may include a photovoltaic detector (e.g., a photovoltaic single absorber detector or a photovoltaic multi-absorber (multi-junction) detector), a barrier device detector, a position sensitive detector (PSD) or other suitable detector. The detector unit cells 160 may include any suitable materials, dopant concentrations, number of layers, layer thicknesses and/or other characteristics selected based on the type of photodetector.

The ROIC 140 may be used for processing of the incident light (e.g., to create an image representative of the incident light). For example, the integrated circuit 140 interfaces with detection device 120 to receive a signal, such as the accumulated charge or the current and/or voltage produced in response to light incident upon the detector unit cells 160. The integrated circuit 140 may include an image processing unit and may include a combination of hardware, software, or firmware that is operable to convert the received signal into an electronic image.

The integrated circuit 140 may include an array of ROIC unit-cells that are arranged in an X×Y matrix corresponding to the chiral orientation of the X×Y matrix of the detector unit cells 160. Thus, each ROIC unit-cell may be interconnected with a corresponding detector unit cell 160 by way of one or more direct bond interconnects, such as direct metal-to-metal interconnects or indium interconnects.

In operation, the ROIC 140 may have one or more operational modes that are stored in a control word store 180. The control word store includes one or more control words, each word having a certain number of bits. The bits forming a control word may be referred to as storage bits herein and each storage bit may be redundantly stored so that there is more than one copy of any particular storage bit. The bits, however, may be subject to change due to an SEU.

Figure 2:
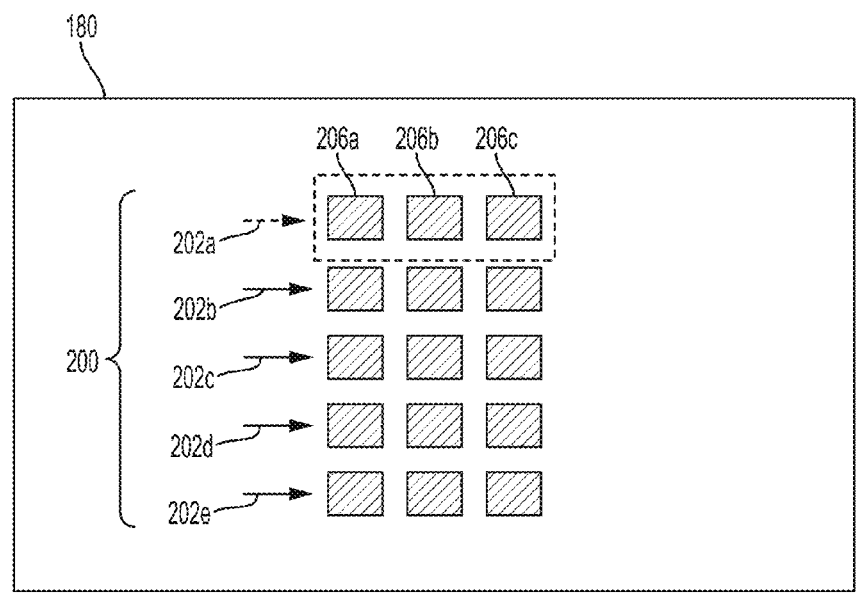
FIG. 2 shows an example of how a single bit may be stored in triplicate in three separate latches according to one embodiment.

FIG. 2 shows an example of a control word store 180 according to one embodiment. In the example shown in FIG. 2, a single control word (dataword 200) is illustrated. Of course, the store 180 could include many more such datawords. As illustrated, the word store 180 includes a 5 bit dataword 200. Each bit 202a-202e of the dataword 200 may be stored in triplicate in this example. That is, each bit 202 may include three latches 206a-206c, all storing the same bit value (e.g., a logical "1" or a logical "0").

It shall be understood that while triplicate is the primary discussed redundant storage scheme herein, the number of redundant bits may be varied depending on the context. In FIG. 2, each bit can be formed, by a plurality of redundant latches that are further described below. Each latch may operate in a so-called synchronous manner in that upon receipt of a program enable signal on a latch enable/clock input (referred to as LE below) the input (D) is stored and provided at the output (Q). Thus, assuming all latches are connected to a common LE reference, all three will synchronously be programmed. The value of D when the LE input in clocked remains at Q until the value of the latch is reset. As described above, in some instance, an SEU event may occur that causes one of the sub-latches 206 (also referred to as a "bit storage element" herein) to change from the stored value. In such a case, embodiments may automatically and, in at least one case, asynchronously, correct the change bit back to its original value. In general, this correction utilizes components in each sub-latch to compare a particular sub-latches' stored value with the other latches and, if different, the value is set to the value of the other sub-latches. It shall be understood that in current applications, the dataword 200 may be only a portion of the total "operational command information" stored for a particular ROIC. Indeed, in some cases, an ROIC may have over a thousand individual bits.

Figure 3:
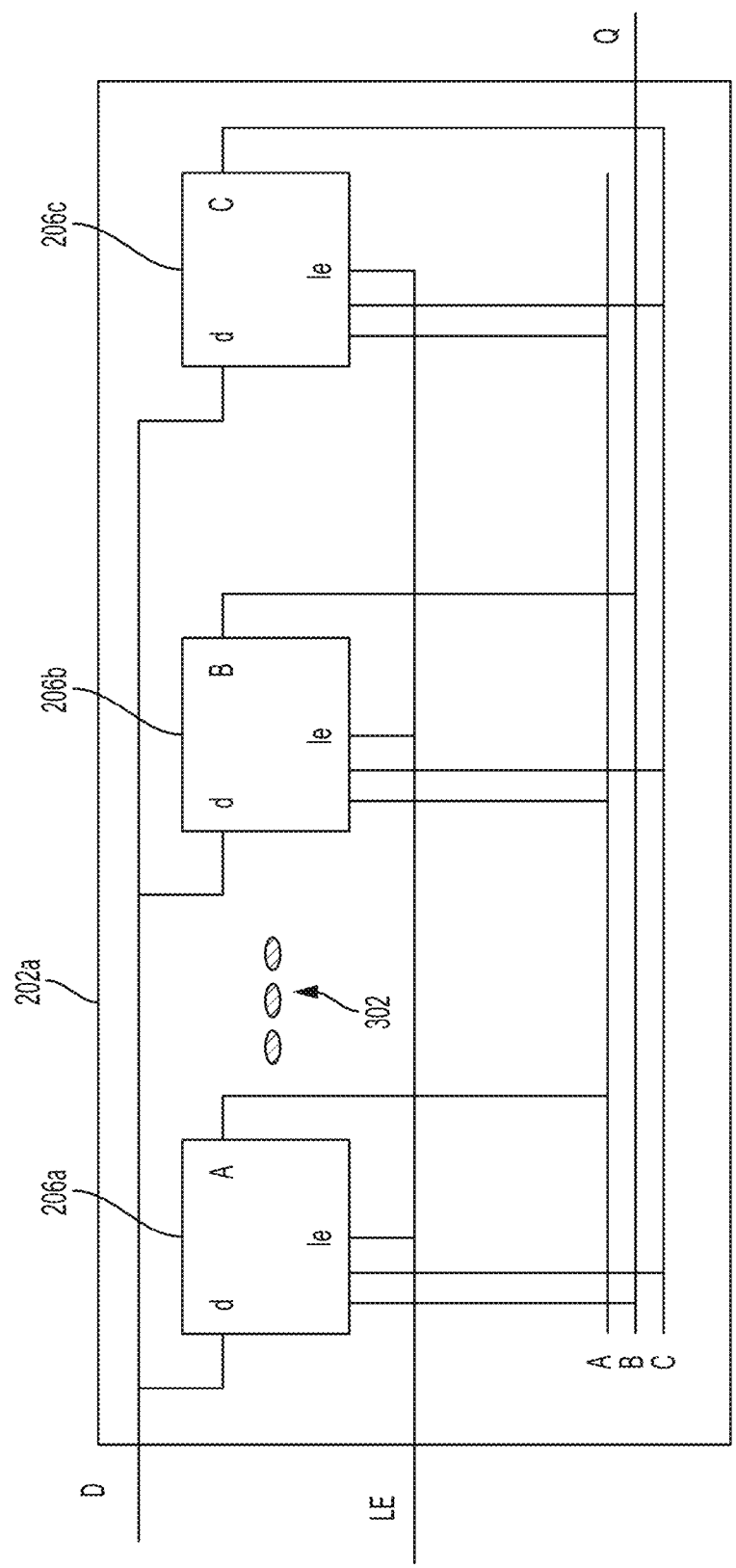
FIG. 3 shows a more detailed depiction of the connections of the latches shown in FIG. 2.

FIG. 3 shows a more detailed depiction of an individual bit 202 of a particular command dataword. By way of example, bit 202a is illustrated. The bit 202a includes in input D and an output Q. Application of a positive voltage to a latch enable (LE) causes, in general, the value at input D to the stored and provided to output Q.

The bit 202a includes one or more sub-latches or bit storage elements 206. In particular, as illustrated, bit 202a includes three bit storage elements 206a, 206b, 206c. In one embodiment, the more bit storage elements may be provided but are not required. The ability to add more bit storage elements is indicated by the ellipses generally denoted by reference numeral 302. The additional bit storage elements 302 may be connected in a manner similar to those shown in FIG. 3 as will be understood by the skilled artisan.

Each of the bit storage elements 206a-c has an input denoted as input d. All of these inputs are connected to the input D of bit 202a. Similarly, each of the bit storage elements 206a-c has latch enable input "le" connected to LE input of bi 202a. Thus, each time the LE input is activated, the value of the input D is stored in triplicate in each bit storage element.

As illustrated, the output of each bit latch 206 is labeled with an output A, B, C, respectively. It will be understood that these outputs hold the input presented to the d input when LE (and thus, le) is enabled. Also, in FIG. 3, the output B of the bit latch 206b is shown as the Q output of the latch 202a. Any of the outputs (A, B, C) could be the output Q.

The skilled artisan will realize that, heretofore, to ensure the values in the bit latches, the values could be cycled with LE repeatedly being driven to refresh the value in them. Herein, the values of outputs of the other bit latches (e.g., bit storage elements) is fed back into each bit latch to automatically correct any changes due to an SEU. For example, to cause automatic (e.g., a synchronous) correction of the bit stored in one of the bit storage element 206, outputs each of the other bit storage elements 206 is connected as correction input into the particular bit storage element. In particular, as illustrated, bit storage element 206a includes correction inputs equal to the values stored in bit storage elements 206b and 206c. This is shown by bit storage element 206a being connected to outputs B and C of bit storage elements 206b and 206c, respectively. Similarly, as illustrated, bit storage element 206b includes correction inputs equal to the values stored in bit storage elements 206a and 206c. This is shown by bit storage element 206b being connected to outputs A and C of bit storage elements 206a and 206c, respectively. In addition, as illustrated, bit storage element 206c includes correction inputs equal to the values stored in bit storage elements 206a and 206b. This is shown by bit storage element 206c being connected to outputs A and B of bit storage elements 206a and 206b, respectively.

Figure 4:
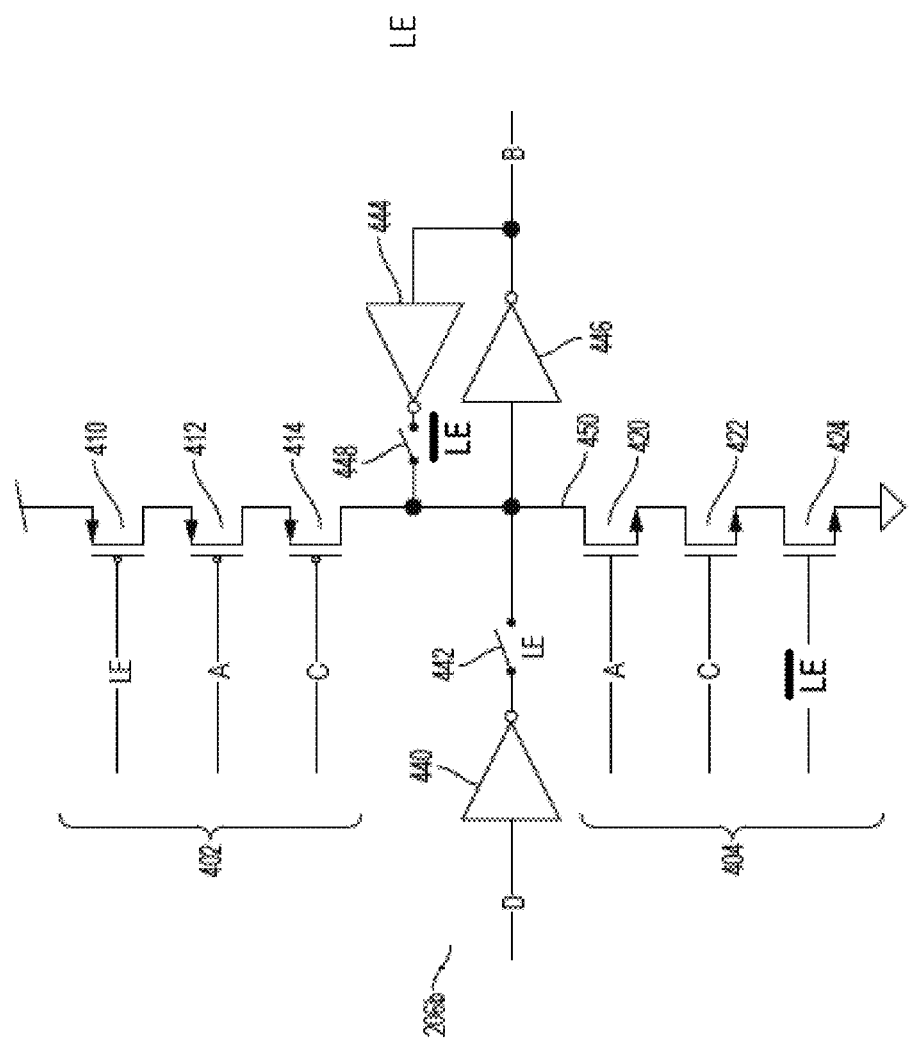
FIG. 4 is shows a circuit diagram at a logical element level of an example of how one of the latches of FIG. 3 may be constructed.

FIG. 4 shows an example of bit storage element 206b and its connections. If shall be understood that while specific transistor types are shown that the skilled artisan could change the particular elements used to achieve the same "bit logical" results without departing from the teachings herein.

The bit storage element 206b includes a standard latching portion that, in this case, is configured as a so-called "D-latch" and includes three inverters 440, 444 and 446 and switches 442 and 448 controller by the LE input. For the time being, elements 402 and 404 are ignored and while the particular operation of the illustrated D-latch is described, the teachings herein can be applied to any latch that includes an inverter feedback circuit (e.g., head to tail connected inverters connected such as shown by inverters 444 and 446). The data signal "D" is provided as an input and inverted by input inverter 440. When LE is positive, first switch 442 is closed and the opposite value of D is provided to a first storage inverter 446. When LE is negative, the second switch 448 is closed and the value of D is provided to the input of the second storage inverter 444. To that end, the closed circuit (when LE is at a logical "0") of the head to tail connected inverters 446, 444 (with switch 448 being disposed between the output of the second inverter 44 and the input of the first inverter 446) holds the bit value that was presented at the D input when LE was set to 1. For simplicity, node 450 shall be referred to as the input to the "storage portion" of the latch. The storage portion is circular path that includes inverters 444 and 446 with switch 448 disposed between them.

Herein, pull up and pull down circuits are provided to correct that stored value if is it found to differ from the values stored in the other bit storage elements. The pull up/down circuit is preferentially contention-based to keep additional power dissipation at a minimum in the absence of SEU events but may optionally be replaced by logic gates providing a similar asynchronous set/reset functionality. In this example, such a difference may occur when the output B is different from both outputs A and C. As illustrated, pull up circuit 402 includes the serially connected pmos transistors (410, 412, 414) connected between a supply voltage and input 450. While as illustrated, LE is the input (e.g., connected to the gate) transistor 410, A is the input to transistor 412 and C is the input to transistor 414, the inputs could be applied to different transistors. When A and C are both "0" or low, and the cell is not be programmed (e.g., LE is a logical "0"), the input is connected to the supply voltage. This will cause the value at that location to go high and, consequently, cause the output B to be driven to and stored as a logical "0".

Conversely, as illustrated, pull down circuit 404 includes the serially connected nmos transistors (420, 422, 424) connected between input 450 and ground. While as illustrated, LE is the input (e.g., connected to the gate) of transistor 424, A is the input to transistor 420 and C is the input to transistor 424, the inputs could be applied to different transistors. When A and C are both "1" or high, and the cell is not be programmed (e.g., LE is a logical "0"), the input 450 is connected to ground. This will cause the value at that location to go low and, consequently, cause the output B to be driven to and stored as a logical "1".

From the above, it can be seen that the values of related bit storage elements will correct errors in other bit storage elements when those elements are not actively being programmed (e.g, LE is low). In this manner, addition of pull up and pull down circuits 402 and 404 to standard bit latches can allow for asynchronous error correction of synchronous devices. In one embodiment, as the update is not performed based on a predetermined clock cycle (or multiples of clock cycles) the recovery can be referred to as immediate (e.g., correction occurs within a new nanoseconds after an SEU event occurred).

The above described system is pin-out compatible with the standard latch cell traditionally used for dataword bit storage and allows seamless replacement while still being functionally fully recognized by the synthesizer as a common latch. It needs no additional control/voting/scrubbing circuits and does not need any write-back of corrected values. As described, each cell contains three bit storage elements (A, B and C), each of the three has an internal asynchronous set/reset control. The reset for A is active when sites B and C are both logic low, the set for A is active when sites B and C are both logic high. Similarly reset for B is active when A and C are low, reset for C is active when A and B are low and so forth. When an SEU event attempts to toggle site A from low to high, then that event is prevented by having bit storage element A held in continuous reset from both sites B and C being low. If an SEU even has enough energy to defeat the asynchronous reset and set A high, the two other bits would keep resetting A until the SEU energy pulse has subsided. The additional power dissipation of the TMR latch vs the standard latch is virtually zero since no clocking is taking place and commanding register bits are typically written once and held constant during operation. Only when an SEU even attempts to toggle one site, does the cell use power to defeat the toggling attempt. The result is a memory cell that corrects itself for SEU events immediately and needs no additional controls to operate. The layout of the standard cell is carefully engineered with guard-rings and ample substrate connections to isolate the substrates of each of the three latches while the asynchronous correction being implemented as a faster path, reducing the probability of a complex SEU event affecting two out of the three latches in the cell within the same sub-nanosecond time period. The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. An electro-optical sensor chip assembly (SCA), comprising:
  a detection device that includes an array of detector unit cells arranged in a matrix and that produce an electrical output in response to light; and
  an integrated control circuit in electrical communication with the detection device, the integrated circuit including:
  a control word store to store a dataword, the control word store including at least three sub-latches to redundantly store at least one bit of the dataword, wherein the at least three sub-latches include a first sub-latch, a second sub-latch and a third sub-latch, each of the first sub-latch, the second sub-latch and the third sub-latch including an output and two recovery inputs, and wherein the output of the first and third sub-latches are connected to the recovery inputs of the second sub-latch;

wherein the second sub-latch includes a latch element having an input and an output, a pull up circuit and a pull down circuit, the pull up circuit connected between a supply voltage and the input of the latch element;

wherein the latch element includes two inverters connected head-to-tail with a switch element between them.

2. The SCA of claim 1, wherein the wherein the output of the first and second sub-latches are connected to the recovery inputs of the third sub-latch.

3. The SCA of claim 2, wherein the outputs of the second and third sub-latches are connected to the recovery inputs of the first sub-latch.

4. The SCA of claim 1, wherein the pull up circuit includes at least two serially connected switching elements controlled by the outputs of the third and first sub-latches.

5. The SCA of claim 4, wherein the at least two serially connected switching elements are p-fet devices and wherein the pull-up circuit further includes a third switching element controlled by a latch enable signal received from the integrated control circuit.

6. The SCA of claim 1, wherein the second sub-latch includes a latch element having an input and an output, a pull up circuit and a pull down circuit connected between a ground and the input of the latch element.

7. The SCA of claim 6, wherein the pull down circuit include at least two serially connected switching elements controlled by the outputs of the third and first sub-latches.

8. The SCA of claim 7, wherein the at least two serially connected switching elements are n-fet devices and wherein the pull down circuit further includes a third switching element controlled by a latch enable signal received from the integrated control circuit.

9. An integrated control circuit for controlling operation of a device, the circuit including:
a supply voltage input;
a ground connection; and
at least three sub-latches to redundantly store at least one bit of the dataword, wherein the at least three sub-latches include a first sub-latch, a second sub-latch and a third sub-latch, each of the first sub-latch, the second sub-latch and the third sub-latch including an output and two recovery inputs, and wherein the output of the first and third sub-latches are connected to the recovery inputs of the second sub-latch;

wherein the output of the first and second sub-latches are connected to the recovery inputs of the third sub-latch;

wherein the second sub-latch further includes:
a latch element having an input and an output, a pull up circuit and a pull down circuit, the pull up circuit connected between the supply voltage input and the input of the latch element;

wherein the latch element includes two inverters connected head-to-tail with a switch element between them.

10. The circuit of claim 9, wherein the outputs of the second and third sub-latches are connected to the recovery inputs of the first sub-latch.

11. The circuit of claim 9, wherein the pull up circuit include at least two serially connected switching elements controlled by the outputs of the third and first sub-latches.

12. The circuit of claim 11, wherein the at least two serially connected switching elements are p-fet devices and wherein the pull-up circuit further includes a third switching element controlled by a latch enable.

13. The circuit of claim 9, wherein the second sub-latch includes a latch element having an input and an output, a pull up circuit and a pull down circuit connected between the ground connection and the input of the latch element.

14. The circuit of claim 13, wherein the pull down circuit include at least two serially connected switching elements controlled by the outputs of the third and first sub-latches.

15. The circuit of claim 14, wherein the at least two serially connected switching elements are n-fet devices and wherein the pull down circuit further includes a third switching element controlled by a latch enable signal received from the integrated control circuit.

* * * * *